(12) United States Patent
Papadopoulos et al.

(10) Patent No.: US 7,273,182 B2
(45) Date of Patent: Sep. 25, 2007

(54) DATA STORAGE MEDIUM HAVING A TEST MODE

(75) Inventors: Constantin Papadopoulos, Ottobrunn (DE); Berndt Gammel, Markt Schwaben (DE)

(73) Assignee: Infineon Technologies AG, Munich (DE)

( * ) Notice: Subject to any disclaimer, the term of this patent is extended or adjusted under 35 U.S.C. 154(b) by 174 days.

(21) Appl. No.: 11/176,941

(22) Filed: Jul. 6, 2005

(65) Prior Publication Data

US 2006/0006243 A1    Jan. 12, 2006

(30) Foreign Application Priority Data

Jul. 6, 2004    (DE) ............... 10 2004 032 707

(51) Int. Cl.
 *G06K 19/06*    (2006.01)
(52) U.S. Cl. .................... 235/492; 235/449
(58) Field of Classification Search ........... 235/492, 235/449, 432, 454, 473, 375; 400/76, 61, 400/70
See application file for complete search history.

(56) References Cited

U.S. PATENT DOCUMENTS

| | | | |
|---|---|---|---|
| 6,247,645 B1 * | 6/2001 | Harris et al. | 235/454 |
| 6,252,444 B1 | 6/2001 | Lee | |
| 6,507,130 B1 | 1/2003 | Thuringer et al. | |
| 2001/0013549 A1 * | 8/2001 | Harris et al. | 235/454 |
| 2002/0191998 A1 * | 12/2002 | Cremon et al. | 400/76 |
| 2003/0048510 A1 * | 3/2003 | Kawashima et al. | 359/142 |
| 2003/0080191 A1 * | 5/2003 | Lubow et al. | 235/462.01 |
| 2005/0034028 A1 * | 2/2005 | Son | 714/43 |
| 2005/0084308 A1 * | 4/2005 | Nakamura et al. | 399/407 |
| 2005/0274800 A1 * | 12/2005 | Chapman et al. | 235/432 |
| 2006/0006243 A1 * | 1/2006 | Papadopoulos et al. | 235/492 |
| 2006/0118631 A1 * | 6/2006 | Lubow et al. | 235/462.01 |

FOREIGN PATENT DOCUMENTS

EP    0 676 073 B2    10/1995

OTHER PUBLICATIONS

Rankl, W. et al.; "Smart Card Handbook"; John Wiley & Sons, Chinchester England, 1997, ISBN: 0 471 96720 3.

\* cited by examiner

*Primary Examiner*—Thien Minh Le
(74) *Attorney, Agent, or Firm*—Dickstein, Shapiro, LLP.

(57) ABSTRACT

A data storage medium having a memory unit, a control unit, and an interface having contact pads for at least one voltage supply and one data transmission. Provision is made of a test signal generating device for generating test signals used to test the data storage medium. The data storage medium can be switched into a test mode in which the test signals are used for the test.

19 Claims, 1 Drawing Sheet

DATA STORAGE MEDIUM HAVING A TEST MODE

CROSS-REFERENCE TO RELATED APPLICATION

This application claims priority to German Patent Application Serial No. 102004032707.6, filed Jul. 6, 2004, which is incorporated herein by reference in its entirety.

FIELD OF THE INVENTION

The invention relates to a data storage medium having a memory unit, a control unit and an interface with contacts which has contact pads for at least one voltage supply and one data transmission.

BACKGROUND OF THE INVENTION

Such data storage media are, for example, chip card controllers which, in a highly developed embodiment, have large flash memories. Current memories have a capacity of several 100 kB. Future generations of chip cards will even have memory units in the MB range.

The more complex and the more extensive the data storage media become, the higher the outlay on functional and quality tests when producing the data storage media.

Special test devices which can simultaneously test and personalize a plurality of data storage media are used to test and personalize the data storage media. The more data storage media can be simultaneously tested and personalized, the lower the costs incurred as a result of the tests and personalization.

A first problem in terms of time spent on the tests and personalization is the possibly low data transfer rate of the interface, in particular if the interface with contacts has been configured in accordance with the corresponding ISO standard for chip cards. The lower the data transfer rate, the longer the test and personalization and the more expensive this operation.

A first possible way (disclosed in the prior art) of reducing the costs of the tests and personalization is therefore to use testers having more test channels so that more data storage media can be simultaneously tested and personalized. However, larger testers are more expensive and are available only with up to a particular number of test channels.

In order to reduce the test and personalization time in the available testers, it is possible to increase the transmission rate of the interface with contacts. However, the maximum transmission rate is limited by the baud rate of the interface used. In order to accelerate personalization, in particular, it is known, for example from the products SLE66 and SLE88 from Infineon Technologies AG, to use a higher external clock frequency for personalization than is provided for in ISO 7816 which is decisive here. In addition, the minimum division factor can be reduced.

Increasing the frequency of the external clock signal further is problematic because neither the test devices nor the contacts are set up for this. Added to this is the fact that data storage media often have sensors which cause the circuit to be reset or data storage medium components to be destroyed in the case of an excessive external clock frequency since it is assumed that a third party is attacking the data storage medium.

However, increasing the frequency of the external clock signal further could not reduce the personalization time of a data storage medium to an unlimited extent either since the personalization time is limited by the programming time of the flash memory if such a memory is used. Increasing the transmission rate further would not, therefore, lead to a reduction in the personalization time.

SUMMARY OF THE INVENTION

It is an object of the invention to specify data storage media whose testing and personalization can be better parallelized in existing testers.

This object is achieved by means of data storage media of the type mentioned initially which are distinguished by the fact that provision is made of a test signal generating device for generating test signals which are needed to test the data storage medium, and the data storage medium can be switched into a test mode in which the test signals which have been generated by the test signal generating devices are used for the test.

BRIEF DESCRIPTION OF THE DRAWINGS

The invention will be explained in more detail below with reference to an exemplary embodiment. In the figures.

DETAILED DESCRIPTION OF PREFERRED EMBODIMENTS OF THE INVENTION

The invention follows the finding that, as explained above, increasing the data transmission rate further does not lead to a reduction in the test and personalization time. In addition, the invention follows the finding that the average test and personalization time per data storage medium can be reduced by testing and personalizing as many data storage media as possible at the same time, that is to say in a parallel manner.

The advantage of the data storage media according to the invention is that the number of test channels—which are required per data storage medium—in the testers is reduced. As a result, more data storage media can be simultaneously tested and personalized in existing testers. This is achieved by virtue of the fact that, in a test mode, an external test signal, for example an external clock signal, is not supplied but rather a corresponding test signal is generated internally and takes the place of the otherwise externally supplied signal. In order to provide a clock signal, for example, an internally generated clock signal can be processed in such a manner that it can take the place of the external clock signal.

Current data storage media have a clock generation unit anyway for the purpose of generating an internal clock signal since this clock is required for maximum power and for security reasons. One advantageous development of the invention skillfully uses this existing component to generate a clock signal for the test from this internal clock signal in a simple manner, said clock signal for the test making it unnecessary to supply an external clock signal.

By way of example, the number of test channels required per data storage medium can thus be reduced from four to three. More than 30% more data storage media can thus be simultaneously tested and personalized in the same test device. The four pads which are normally occupied by one test channel are the pads for the clock signal, a reset signal, the data signal and the supply voltage.

In one advantageous development of the invention, the external reset signal is also replaced, during testing, with a signal that is generated in the data storage medium. A test reset signal can be derived from an internal signal which is generated anyway. Such a signal is, for example, the power-on reset signal.

Figure 1:
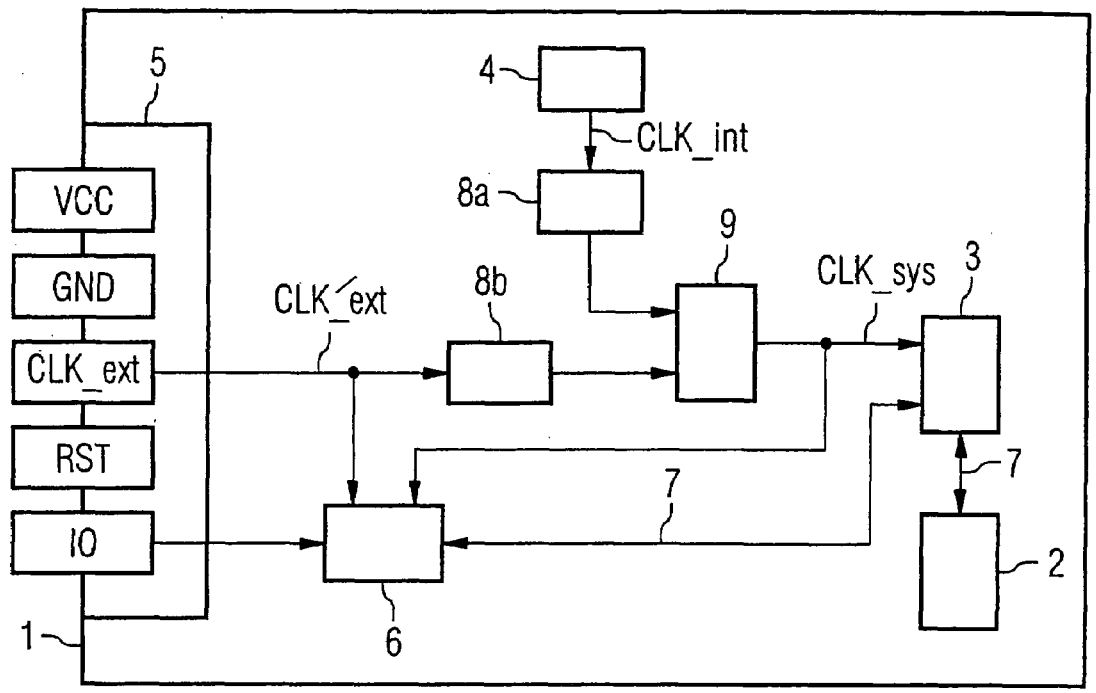
FIG. 1 shows a data storage medium according to the invention in which a clock signal for the test is provided in a test mode.

FIG. 1 shows a diagrammatic illustration of a data storage medium according to the invention. The data storage medium 1 has a memory unit 2, a control unit 3 and an interface 5 with contacts which comprises contact pads and has an interface monitoring unit 6 for transmitting data. The interface monitoring unit 6, the memory unit 2 and the control unit 3 are connected to one another via a bus 7. The control unit 3 can use the bus to write data to, and read data from, the memory unit 2. The interface monitoring unit 6 makes it possible to preprocess data, which are provided on the bus 7, in accordance with the interface specifications in such a manner that they can be output via the corresponding contact pad 'IO'. In the opposite direction, the data which are received at the contact pad 'IO' are converted in such a manner that they can be read by the control unit 3 via the bus 7.

In the case of the data storage media described, it is standard practice to provide an external clock signal CLK_EXT at one of the contact pads and, if appropriate after processing by a downstream clock signal processing device 8b, to use it for processing data in the data storage medium. Possible processing is, for example, dividing the frequency. Present-day data storage media frequently also have their own clock generation unit 4 which provides an internal clock signal CLK_INT at a frequency which is generally higher than the frequency of the external clock signal CLK_EXT. The internal clock signal CLK_INT is used to enable particular processing operations to be carried out at a higher speed. In addition, security measures may be implemented using the internal clock signal CLK_INT. The clock generation unit 4 is therefore connected to the control unit 3, it being possible to process the internal clock signal CLK_INT using a clock signal processing device 8a which may be interposed.

The further connections of the data storage medium of FIG. 1 are provided for the purposes of supplying a supply voltage VCC, connecting the data storage medium to a reference potential GND and supplying an external reset signal.

In order to test and personalize such a data storage medium, test signals must be applied to the connections VCC, CLK_EXT, IO and RST in a tester, that is to say four test channels must be provided per data storage medium. The idea according to the invention is not to supply individual signals from the outside but rather, if possible, to generate them in the data storage medium itself so that one test channel, which can be used to test another data storage medium in a parallel manner, becomes free for each signal "saved".

In accordance with the exemplary embodiment of FIG. 1, the external clock signal CLK_EXT is replaced with a clock signal that is generated in the data storage medium. The internal clock signal CLK_INT is generally at a frequency which is higher than the frequency of the external clock signal CLK_EXT. Provision is therefore made of a clock signal processing device 8a which uses the internal clock signal CLK_INT to generate a clock signal at a suitable frequency. The clock signal processing devices 8a and 8b are each connected to a clock signal selection device 9. A system clock signal CLK_SYS which is used to operate the data storage medium can be tapped off at an output of the clock signal selection device 9.

During normal operation, the data storage medium is supplied with the system clock signal CLK_SYS which is either derived from the internal clock signal CLK_INT using the clock signal processing device 8a or from the external clock signal CLK_EXT using the clock signal processing device 8b.

The interface monitoring unit 6 requires both the external clock signal CLK_EXT and the system clock signal CLK_SYS.

According to the invention, during test operation, the data storage medium is operated using the system clock signal CLK_SYS which has been derived from the internal clock signal instead of using the external clock signal CLK_EXT. The interface monitoring apparatus 6 also receives only the internal clock signal instead of the external clock signal.

When testing a data storage medium according to the invention, only three test channels thus need to be used, namely for the supply voltage VCC, the data signal IO and the reset signal RST_EXT.

Figure 2:
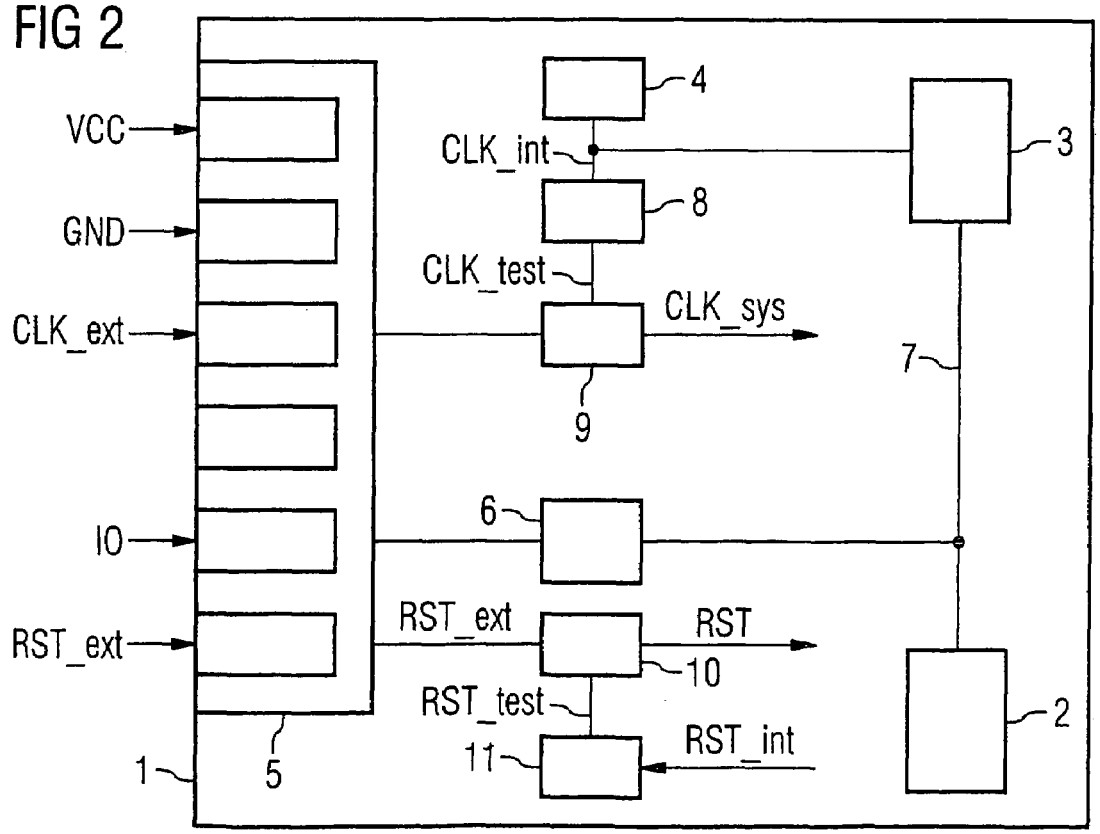
FIG. 2 shows a data storage medium according to the invention in which a test reset signal is also additionally provided.

FIG. 2 shows a further development of the data storage medium of FIG. 1. In this exemplary embodiment, the external reset signal RST_EXT is additionally replaced with an internally generated reset signal in the test mode. In accordance with the present exemplary embodiment, the so-called power-on reset signal is used to generate a test reset signal RST_TEST which takes the place of an externally supplied reset signal RST_EXT. The power-on reset signal is normally used to reset all of the circuit components after the supply voltage has been applied. As the voltage rises from zero to a desired voltage value, logic circuit components assume undefined logic states under certain circumstances. In order to ensure correct operation of the circuit, it is therefore necessary to carry out a reset operation after a defined minimum supply voltage value has been reached so that all of the circuit components assume defined states.

In this exemplary embodiment, the power-on reset signal is used to trigger a timer which, after a predetermined period of time, generates a test reset signal which can take the place of the external reset signal RST_EXT. A reset signal selection device 10 undertakes the function of connecting the contact pad which is provided for the external reset signal RST_EXT to an output of the reset signal selection device 10 or else of connecting a reset signal generating device 11 to the output of the reset signal selection device. In the test mode, the test reset signal RST_TEST which has been generated by the reset signal generating device 11 is chosen and thus takes the place of an externally supplied reset signal RST_EXT. In contrast, during normal operation, the output of the reset signal selection device 10 is connected to the corresponding contact pad.

When testing the data storage medium, only two test channels in a tester are thus required, namely for the supply voltage VCC and for the data signal IO. In this configuration, twice as many data storage media as in data storage media in accordance with the prior art can be simultaneously tested and personalized in an existing tester. The costs of testing and personalization, which are proportional to the time required, can thus be reduced by 50%.

Depending on the type of data storage media to be tested, other signals are, under certain circumstances, supplied during testing and personalization. It goes without saying that the invention also extends to such other signals by creating a replacement for these externally supplied signals in the data storage medium and, in a test mode, resorting to the signals which are generated in the data storage medium while using the externally supplied signals during normal operation.

In order to protect against manipulation, it must be ensured that it is not possible to change into the test mode as desired. The control unit 3 which also drives the selection devices 9 and 10 in a corresponding manner can carry out the operation of changing over into the test mode. It goes without saying that all security measures which are also used in other test modes and with which the person skilled in the art is thus familiar can be applied to this operation of changing over the operating mode. By way of example, the test mode can be set only when a fuse is still intact. The test mode is preferably set automatically if the fuse is intact. After the test has been concluded, the fuse is destroyed in an irreversible manner. This prevents the data storage medium from being able to be operated in the test mode at a later time after it has been delivered and in this way attempting to acquire secret information.

In accordance with the exemplary embodiment described here, a data storage medium is tested in the following manner.

After the power supply has been connected, the internal voltage is regulated to 1.5 V in a first phase. When the voltage is stable, a power-on reset signal is generated. Unlike in all of the other operating modes, the control unit 3 now boots without an external reset signal. This is achieved by generating a test reset signal (as described). The internal clock generator 4 begins to oscillate.

In a second phase, communication via the interface with contacts is prepared. In this case, without an external clock signal, it is necessary to synchronize the frequency of a connected test device and the frequency of the interface monitoring unit 6. In this case, a register bit determines whether a clock signal line of the interface monitoring apparatus 6 is connected to the IO connection or to an internal system clock line.

After this has taken place, a waiting phase occurs. This is necessary since the period that is actually required for synchronization can vary from data storage medium to data storage medium. After this generally short waiting phase, the external test device sends a command to the connection "IO". The clock signal used in the interface monitoring unit 6 must be changed over beforehand to the system clock signal CLK_SYS which is now synchronized with the external test device. The changeover switch used for this purpose is controlled using a register bit, as described above.

In a fourth phase, the command phase, the external test device sends commands to the data storage medium and receives responses from the data storage medium via the IO connection.

What is claimed is:

1. A data storage medium comprising:
    a memory unit;
    a control unit;
    an interface having contact pads for at least one voltage supply and one data transmission;
    a signal generating device configured to generate predetermined test signals for testing the data storage medium; and
    a selection apparatus configured to select between the predetermined test signals from the signal generating device and signals from the contact pads for transmitting data,
    wherein the data storage medium can be switched into a test mode in which the predetermined test signals generated by the signal generating devices are chosen by the selection apparatus and are supplied to the control unit.

2. The data storage medium as claimed in claim 1, wherein the interface has a contact pad for an external clock signal, and the signal generating device is a clock generation unit that generates an internal clock signal, and
    wherein the data storage medium further comprises a clock signal processing device which uses the internal clock signal, in the test mode, to generate a clock signal which replaces the external clock signal.

3. The data storage medium as claimed in claim 1, wherein the interface has a contact pad for an external reset signal, and
    wherein an internal reset signal is used, in the test mode, to generate a test reset signal which replaces the external reset signal.

4. The data storage medium as claimed in claim 1, wherein the interface is configured in accordance with ISO 7816.

5. The data storage medium as claimed in claim 1, wherein the memory unit is a flash memory.

6. A data storage medium comprising:
    a memory unit;
    a control unit;
    an interface having contact pads for at least one voltage supply and one data transmission;
    a signal generating means for generating predetermined test signals for testing the data storage medium; and
    a selection means for selecting between the predetermined test signals from the signal generating means and signals from the contact pads for transmitting data,
    wherein the data storage medium can be switched into a test mode in which the predetermined test signals generated by the signal generating means are chosen by the selection means and are supplied to the control unit.

7. The data storage medium as claimed in claim 6, wherein the interface has a contact pad for an external clock signal, and the signal generating means is a clock generation unit that generates an internal clock signal, and
    wherein the data storage medium further comprises a clock signal processing means for using the internal clock signal, in the test mode, for generating a clock signal which replaces the external clock signal.

8. The data storage medium as claimed in claim 6, wherein the interface has a contact pad for an external reset signal, and
    wherein an internal reset signal is used, in the test mode, to generate a test reset signal which replaces the external reset signal.

9. The data storage medium as claimed in claim 6, wherein the interface is configured in accordance with ISO 7816.

10. The data storage medium as claimed in claim 6, wherein the memory unit is a flash memory.

11. A method for testing a data storage medium having a memory unit, a control unit and an interface having contact pads for at least one voltage supply and one signal for transmitting data, the data storage medium having a test mode in which at least the operation of the memory unit or of the control unit is checked by processing predetermined test signals, the method comprising:
    forwarding, via a selection apparatus, either a signal from a signal generating apparatus or a signal from the interface to at least the control unit, and
    selecting, via the selection apparatus in the test mode, the signal generating apparatus and passing predetermined test signals, which are used to test the operation of the data storage medium, to at least the control unit.

12. The method for testing a data storage medium as claimed in claim 11, wherein the selection apparatus has a single output connected to the control unit, and wherein the forwarding step comprises forwarding via the selection apparatus either an internal test signal from a signal generating apparatus or an external signal from the interface to at least the control unit.

13. A computer program having a program code for performing a method for testing a data storage medium having a memory unit, a control unit and an interface having contact pads for at least one voltage supply and one signal for transmitting data, the data storage medium having a test mode in which at least the operation of the memory unit or of the control unit is checked by processing predetermined test signals, comprising: (a) forwarding, via a selection apparatus, either a signal from a signal generating apparatus or a signal from the interface to at least the control unit; and (b) selecting, via the selection apparatus in the test mode, the signal generating apparatus and passing predetermined test signals, which are used to test the operation of the data storage medium, to at least the control unit, when the computer program runs on a computer.

14. A system for performing a method for testing a data storage medium having a memory unit, a control unit and an interface having contact pads for at least one voltage supply and one signal for transmitting data, the data storage medium having a test mode in which at least the operation of the memory unit or of the control unit is checked by processing predetermined test signals, the system comprising:

a processor;

a memory communicatively coupled to the processor; and software executing in the processor configured to:

a) forward, via a selection apparatus, either a signal from a signal generating apparatus or a signal from the interface to at least the control unit; and b) select, via the selection apparatus in the test mode, the signal generating apparatus and pass predetermined test signals, which are used to test the operation of the data storage medium, to at least the control unit.

15. A data storage medium comprising:

a memory unit;

a control unit;

an interface having contact pads for external signals comprising at least one voltage supply and one data transmission;

a signal generating device configured to generate predetermined internal test signals for testing the data storage medium; and a selection apparatus, which has a single output connected to the control unit, configured to selectively connect either the predetermined internal test signals from the signal generating device or at least one of the external signals from the contact pads for transmitting data to the output, wherein the data storage medium can be switched into a test mode in which the predetermined test signals generated by the signal generating devices are chosen by the selection apparatus and are supplied to the control unit.

16. The data storage medium as claimed in claim 15, wherein the interface has a contact pad for an external clock signal, and the signal generating device is a clock generation unit that generates an internal clock signal, and wherein the data storage medium further comprises a clock signal processing device which uses the internal clock signal, in the test mode, to generate a clock signal which replaces the external clock signal.

17. The data storage medium as claimed in claim 15, wherein the interface has a contact pad for an external reset signal, and wherein an internal reset signal is used, in the test mode, to generate a test reset signal which replaces the external reset signal.

18. The data storage medium as claimed in claim 15, wherein the interface is configured in accordance with ISO 7816.

19. The data storage medium as claimed in claim 15, wherein the memory unit is a flash memory.

* * * * *